(12) United States Patent
Xiao et al.

(10) Patent No.: US 11,105,197 B2
(45) Date of Patent: Aug. 31, 2021

(54) METHOD AND APPARATUS FOR PRE-LOADING A PIEZOELECTRIC TRANSDUCER FOR DOWNHOLE ACOUSTIC COMMUNICATION

(71) Applicants: Xiaojun Xiao, Calgary (CA); John-Peter van Zelm, Calgary (CA); John Godfrey McRory, Calgary (CA)

(72) Inventors: Xiaojun Xiao, Calgary (CA); John-Peter van Zelm, Calgary (CA); John Godfrey McRory, Calgary (CA)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 16/861,680

(22) Filed: Apr. 29, 2020

(65) Prior Publication Data
US 2020/0355068 A1    Nov. 12, 2020

Related U.S. Application Data

(62) Division of application No. 16/335,152, filed as application No. PCT/CA2017/051219 on Oct. 13, 2017, now Pat. No. 10,669,842.
(Continued)

(51) Int. Cl.
*E21B 47/16* (2006.01)
*B06B 1/06* (2006.01)
(Continued)

(52) U.S. Cl.
CPC ............ *E21B 47/16* (2013.01); *B06B 1/0611* (2013.01); *H01L 41/0536* (2013.01); *H04R 17/00* (2013.01); *B06B 2201/73* (2013.01)

(58) Field of Classification Search
CPC ..... E21B 47/16; H01L 41/0536; H04R 17/00; B06B 1/0611; B06B 2201/73
(Continued)

(56) References Cited

U.S. PATENT DOCUMENTS 4,312,241 A * 1/1982 Budraitis ............... G01L 1/14
73/862.325
4,598,592 A * 7/1986 McMaster .............. G01L 1/16
310/328

(Continued)

FOREIGN PATENT DOCUMENTS

WO         199624751 A1     8/1996

OTHER PUBLICATIONS

Notification of Transmittal of the International Search Report and the Written Opinion of the International Searching Authority; PCT/CA2017/051219; dated Jan. 9, 2018; 8 pages.

*Primary Examiner* — Omar Casillashernandez
(74) *Attorney, Agent, or Firm* — Cantor Colburn LLP

(57) ABSTRACT

A downhole acoustic transmitter has a piezoelectric transducer, an enclosure in which the piezoelectric transducer is housed, a transducer preload means which applies a selected compressive force against the transducer such that a mechanical preload is applied to the transducer, and an acoustic tuning element which has a first end coupled to the transducer preload means or the transducer, and an open second end. The acoustic tuning element is not coupled to anything but the transducer preload means or transducer, so the transducer preload means effectively has a second open end and thus can maintain the same preload compressive force on the transducer even when the transmitter is subjected to tension and compressive forces during operation.

2 Claims, 7 Drawing Sheets

Related U.S. Application Data

(60) Provisional application No. 62/407,897, filed on Oct. 13, 2016.

(51) Int. Cl.
*H01L 41/053* (2006.01)
*H04R 17/00* (2006.01)

(58) Field of Classification Search
USPC .......................................................... 367/82
See application file for complete search history.

(56) References Cited

U.S. PATENT DOCUMENTS

| | | | |
|---|---|---|---|
| 5,166,908 A * | 11/1992 | Montgomery | E21B 47/26 367/165 |
| 5,973,441 A * | 10/1999 | Lo | H01L 41/098 310/330 |
| 2002/0118849 A1 | 8/2002 | Chang et al. | |
| 2005/0152219 A1 * | 7/2005 | Garcia-Osuna | G01V 1/52 367/25 |
| 2015/0275655 A1 * | 10/2015 | Swett | G01V 1/159 367/83 |
| 2019/0226330 A1 | 7/2019 | Xiao | |

* cited by examiner

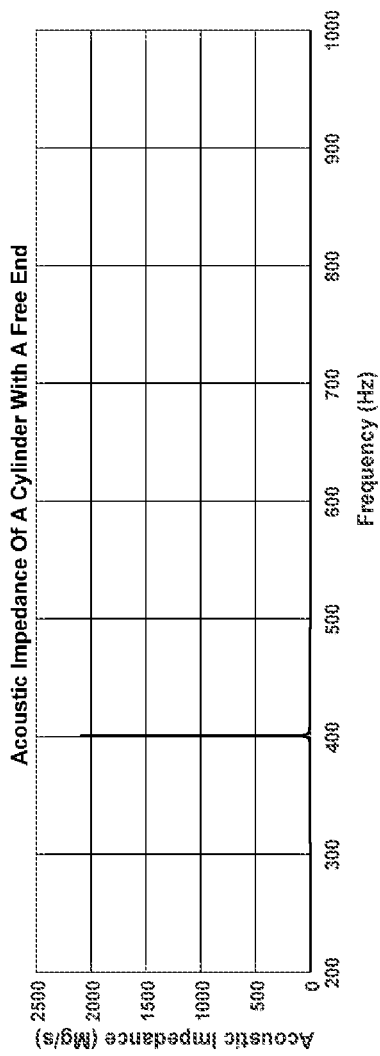
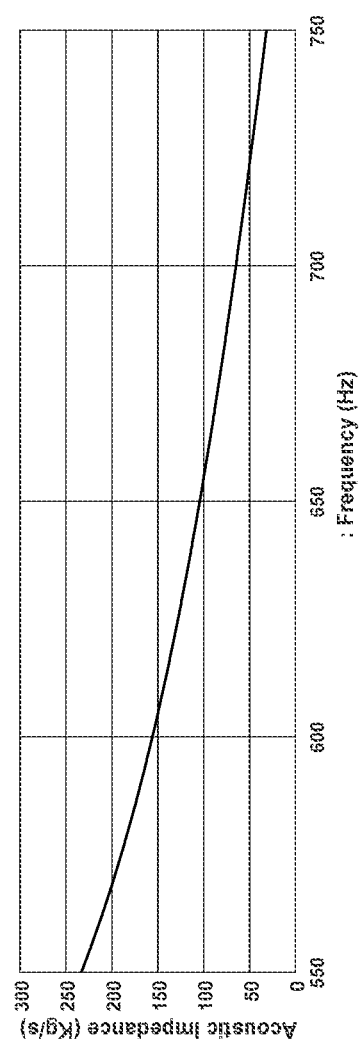

METHOD AND APPARATUS FOR PRE-LOADING A PIEZOELECTRIC TRANSDUCER FOR DOWNHOLE ACOUSTIC COMMUNICATION

CROSS-REFERENCE TO RELATED APPLICATIONS

This application is a divisional of and claims priority to U.S. application Ser. No. 16/335,152 filed Mar. 20, 2019, which claims priority to U.S. Provisional Patent Application No. 62/407,897, filed Oct. 13, 2016, the disclosure of which is incorporated by reference herein in its entirety.

FIELD

This disclosure relates generally to a downhole acoustic transmitter having a pre-loaded piezoelectric transducer and a method for pre-loading a piezoelectric transducer for use in downhole communication such as downhole acoustic telemetry.

BACKGROUND

The evolution of modern oil and gas wells has led to increases in both the depth of the wells and the complexity of the procedures and equipment needed for drilling and completions operations. Additionally, there is an ongoing need for improved safety and efficiency in the drilling and completions process. The combination of these factors has created a need for improved visibility of the downhole conditions along the length of the drill string and at the bottom hole assembly (BHA) during drilling and completions operations. Downhole sensor measurements such as downhole bore and annular pressure, drill string torque and tension, and temperature can be transferred from a downhole location to the surface through one of several known telemetry methods.

One method of downhole communication is wired drill pipe telemetry, which offers very high bandwidths, but tends to be expensive to deploy and prone to failure. Another known downhole communication method is mud pulse telemetry which encodes sensor data into pressure waves that are induced in the drilling fluid flowing in the drill string. Drawbacks to mud pulse telemetry include an inability to transmit when drilling fluid is not flowing, and relatively low data rate transmissions which decrease as the depth of the well increases. A third method of downhole communication is electromagnetic (EM) telemetry, which transmits digitally modulated electromagnetic waves through the formations surrounding the drill string to a surface receiver. EM telemetry does not require the flow of drilling fluid and can provide a higher data transmission rate than mud pulse telemetry, but can be sensitive to the nature of the formations surrounding the well and may not be well suited for deeper wells.

A fourth method of downhole communication is acoustic telemetry, which has proven to be well suited for the modern drilling environment. Acoustic telemetry is capable of transmitting hundreds of bits per second, and since it uses the body of the drill pipe as its transmission medium, it is insensitive to the surrounding formation or casing, and does not require any fluid flow to enable the transmission of data.

There are currently three different implementations of acoustic telemetry systems in downhole tools that use acoustic telemetry: probe-based, clamp-on, and collar-based. These systems typically comprise components including sensors, electronics, batteries and an acoustic transmitter. The probe-based implementation is mounted at least partially within the bore of the drill pipe. The clamp-on implementation is mounted on the external wall of the drill pipe. The collar-based implementation places the components within an annular space in the downhole tool.

In a typical drilling or completions environment, a number of acoustic transmitters can be spaced along the length of the drill string. The most common type of acoustic transducer used within downhole tools comprises a cylindrical piezoelectric stack mounted in a collar-based implementation. Such a stack comprises a number of thin piezoceramic discs layered with thin electrodes between each disc which are connected electrically in parallel. As is known in the art, such as disclosed in U.S. Pat. No. 6,791,470, the entirety of which is incorporated by reference herein, an advantage of the piezoelectric stack when compared to other acoustic transducer types is that the acoustic impedance of the stacked ring structure can be closely matched to the acoustic impedance of the tool's structure thereby optimizing the transfer of acoustic energy from the stack into the tool body, and subsequently into the drill string. Any acoustic impedance mismatch between the stack and the tool surrounding structure results in a reduction in the acoustic output power of the tool.

The piezoelectric stack structure offers a large displacement force combined with a high energy conversion efficiency and high compressive strength, but offers little resistance to tension, even that incurred when voltage is applied. Due to its low tensile strength, it is common practice to place a piezoelectric stack under a mechanical compressive preload along the stack's axis of operation in order to maintain stack integrity while being actuated. The magnitude of the preload can compensate for dynamic forces, but also affects the mechanical energy output from the stack. If there is no compressive preload or if the compressive preload exceeds the blocking force of the piezoelectric material, then there is no mechanical energy output from the stack. An optimum preload level that will maximize the output mechanical energy from the stack occurs when the stiffness of the preloaded stack is equal to the stiffness of the mechanical load.

Referring to FIG. 1, a prior art collar-based piezoelectric stack-type acoustic transmitter 301 comprises first and second thermal expansion compensation rings 302a and 302b, a retaining ring 303, end coupling 304, a steel outer housing 305, a mandrel 306, a pin 307, and a piezoelectric stack 308. The first and second thermal expansion rings 302a and 302b are designed to compensate for the difference between the thermal expansion of the steel housing 305 and the piezoelectric stack 308. The mandrel 306 is threaded into the end coupling 304, and the first thermal expansion compensation ring 302a is slid down the mandrel 306 to an inner face 309 of the end coupling 304. The piezoelectric stack 308 is slid down the mandrel 306 to rest against the first thermal compensation ring 302a. The second thermal compensation ring 302b is slid down the mandrel 306 to rest against the end of the piezoelectric stack 308, and the retaining ring 303 is placed on the mandrel 306 against the second thermal compensation ring 302b. The outer housing 305 is placed over the mandrel 306, first and second thermal compensation rings 302a, 302b and the retaining ring 303 and threaded onto the end coupling 304. The pin 307 is threaded into the housing 305 until the thread is shouldered, and an inner face of the pin 310 is forced against the retaining ring 303 which in turn forces the thermal compensation rings 302a, 302b and the piezoelectric stack 308 against the immovable inner face 309 of the end coupling 304, thereby creating a compressive preload force on the piezoelectric stack 308. The amount of compressive force on the piezoelectric stack can be controlled by varying the length of the retaining ring 303.

The prior art acoustic transmitter 301 will maintain a positive compressive preload on the piezoelectric stack 308 over a limited range of tension/compression on the downhole tool. However, in deeper wells such as those drilled offshore, the tension/compression applied to the downhole tool by external forces can result in the tool flexing enough to either reduce the preload to zero, or to compress the piezoelectric stack beyond its compressive limits. Thus there is a need for a method of applying a compressive preload to the piezoelectric stack in a downhole acoustic transmitter that will maintain an effective preload over the entire range of tension and compression applied to the downhole tool by the drill string while operating in a downhole environment.

SUMMARY

According to one aspect, there is provided a downhole acoustic transmitter for use in downhole communication, comprising an enclosure defining an annular space, and the following components in the annular space: a piezoelectric transducer, a transducer preload means and an acoustic tuning element. The downhole acoustic transmitter can be mounted in a telemetry tool or a repeater of a drill string. The enclosure comprises a first end coupling, a second end coupling, a tubular outer housing having a first end coupled to the first end coupling and a second end coupled to the second end coupling, and an inner mandrel inside the outer housing and extending between the first and second end couplings such that the annular space is defined between the mandrel and the outer housing. The piezoelectric transducer has a first end contacting an inner face of the first end coupling in an axial direction. The transducer preload means has a first end connected to the first end coupling or the first end of the piezoelectric transducer, and a second end contacting a second end of the piezoelectric transducer such that a compressive preload force is applied against the piezoelectric transducer in the axial direction. The acoustic tuning element has a first end attached to the transducer preload means or to the second end of the piezoelectric transducer, and a second end that is axially spaced from the second end coupling such that an axial gap is defined there between, and such that the piezoelectric transducer, transducer preload means and acoustic tuning element are attached to the enclosure only at the first end coupling.

The axial gap can have an axial length selected such that the second end coupling will not contact the acoustic tuning element while the transmitter is operating downhole within design parameters.

The piezoelectric transducer can comprise an annular stack of annular piezoceramic discs with electrodes between each disc, wherein the annular stack is slidable over the mandrel.

The transducer preload means can be a cylindrical casing having a first end connected to the first end coupling or the first end of the piezoelectric transducer, and a second end contacting the second end of the piezoelectric transducer; for example, the casing can comprise a metal tube slidable over or under the piezoelectric transducer, with threads at each end of the metal tube that engage with threads at the first end coupling or first end of the piezoelectric transducer, and with threads at the second end of the piezoelectric transducer. Alternatively, the transducer preload means can be comprised of a tensioned carbon fiber or glass fiber wrap surrounding the piezoelectric transducer, or multiple rods, strips or straps extending along the length of the piezoelectric transducer.

The acoustic tuning element can comprise a metal cylinder having a first end connecting to the second end of the transducer or transducer preload means. The acoustic tuning element can have a selected acoustic impedance that maximizes power transfer from the piezoelectric stack into the enclosure over a selected operating frequency bandwidth. One or more of mass density, mass distribution, length and cross sectional area of the acoustic tuning element can be selected to provide the selected acoustic impedance. The acoustic tuning element can also have a selected center frequency wherein the acoustic impedance of the acoustic tuning element matches the acoustic impedance of the piezoelectric transducer and the selected operating frequency bandwidth is up to 15% of the center frequency.

The downhole acoustic transmitter can also be comprised of at least two acoustic tuning elements, wherein a second acoustic tuning element is tuned to a different quarter wavelength frequency than the first acoustic tuning element, or is tuned for a different acoustic passband at either a higher or a lower frequency than the first acoustic tuning element.

According to another aspect there is provided a downhole acoustic telemetry node comprising: one or more sensors for measuring a local borehole environment and one or more mechanical conditions of a drill string; a processor and memory communicative with the one or more sensors for storing measurements taken by the one or more sensors; and the downhole acoustic transmitter, which is communicative with the processor and memory for transmitting the measurement.

According to another aspect, there is provided a method for acoustic transmission from a downhole location, comprising: applying a compressive preload force in an axial direction against a piezoelectric transducer by a transducer preload means such that the piezoelectric transducer is compressed; tuning the acoustic impedance of the piezoelectric transducer by attaching a first end of an acoustic tuning element having a selected acoustic impedance; wherein an assembly comprising the piezoelectric transducer, transducer preload means and acoustic tuning element is attached to a first end coupling of a downhole acoustic transmitter, and wherein a second end of the acoustic tuning element is spaced from a second end coupling of the enclosure such that an axial gap is defined there between; and applying a voltage to the piezoelectric transducer to generate an acoustic transmission.

Tuning the acoustic impedance of the piezoelectric transducer can comprise selecting an acoustic impedance of the acoustic tuning element that when combined with an acoustic impedance of the piezoelectric transducer and transducer preload means, matches the acoustic impedance of an inner face of the first end coupling contacting the piezoelectric transducer.

BRIEF DESCRIPTION OF THE DRAWINGS

The following descriptions should not be considered limiting in any way. With reference to the accompanying drawings, like elements are numbered alike:

FIG. 6(*a*) is a graph showing a first maximum acoustic impedance in an example steel cylinder having a first constrained end and a second free end, and FIG. 6(*b*) is a graph showing the magnitude of the cylinder's acoustic impedance across a third acoustic passband of the drill string as shown in FIG. 3.

DETAILED DESCRIPTION

Directional terms such as "top", "bottom", "upwards", "downwards", "vertically", and "laterally" are used in the following description for the purpose of providing relative reference only, and are not intended to suggest any limitations on how any article is to be positioned during use, or to be mounted in an assembly or relative to an environment.

Additionally, the term "couple" and variants of it such as "coupled", "couples", and "coupling" as used in this description is intended to include indirect and direct connections unless otherwise indicated. For example, if a first device is coupled to a second device, that coupling may be through a direct connection or through an indirect connection via other devices and connections. Similarly, if the first device is communicatively coupled to the second device, communication may be through a direct connection or through an indirect connection via other devices and connections.

Furthermore, the singular forms "a", "an", and "the" as used in this description are intended to include the plural forms as well, unless the context clearly indicates otherwise.

The embodiments described herein relate generally to a downhole acoustic transmitter having a pre-loaded piezoelectric transducer and a method for pre-loading a piezoelectric transducer for use in downhole acoustic communication such as downhole telemetry. The transmitter comprises the transducer, an enclosure in which the piezoelectric transducer is housed, and a transducer preload means which applies a selected compressive force against the transducer such that a mechanical preload is applied to the transducer, which has a first end contacting a first end coupling of the enclosure. In one embodiment, the transducer preload means comprises a casing having a first end coupled to the first end coupling and a second end that contacts a second end of the transducer such that the compressive force is applied against the transducer. The transmitter also comprises an acoustic tuning element which has a first end coupled to the second end of the casing or the second end of the transducer, and an open second end, i.e. there is a gap between the second end of the tuning element and a second end coupling of the enclosure. The acoustic tuning element is not coupled to anything but the casing or transducer, so the casing effectively has a second open end and thus can maintain the same preload compressive force on the transducer even when the transmitter is subjected to tension and compressive forces during operation.

The acoustic tuning element is tuned such that the acoustic impedance seen by the piezoelectric transducer at its second end, comprising the combination of the acoustic impedance of the tuning element and the acoustic impedance of the casing contacting that end, is equal to the acoustic impedance offered to the transducer at its first end by the face of the first end coupling, thereby maintaining the output power of the transducer.

Figure 1:
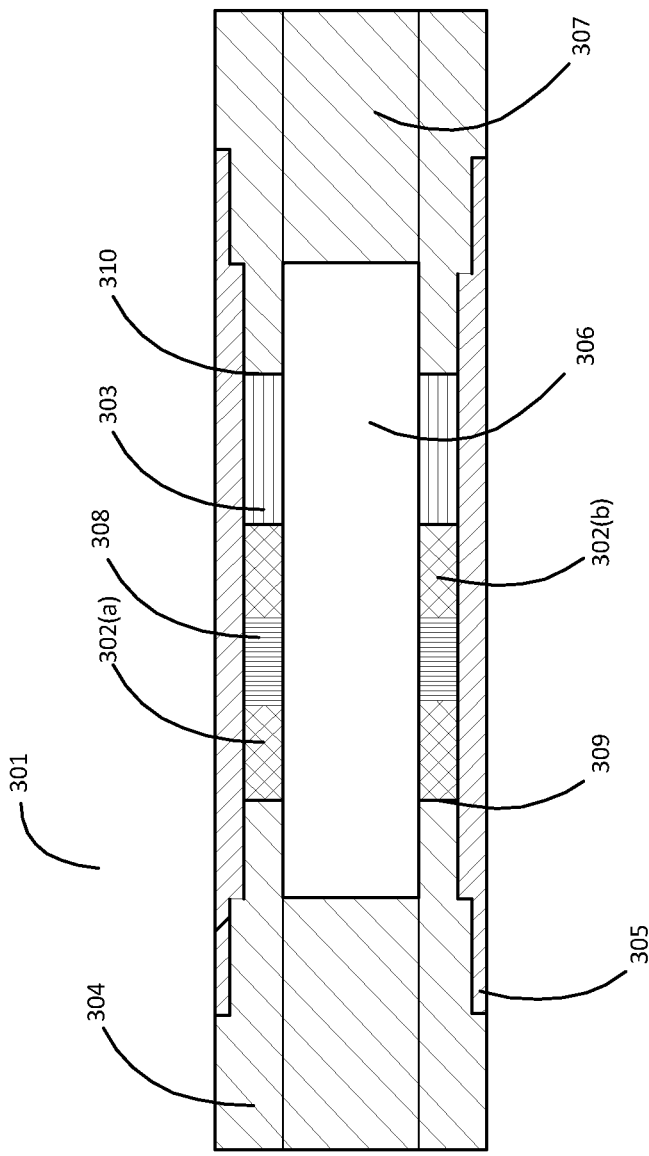
FIG. 1 is a schematic side sectioned view of a downhole acoustic transmitter used in a downhole acoustic communication system (PRIOR ART).
Figure 2:
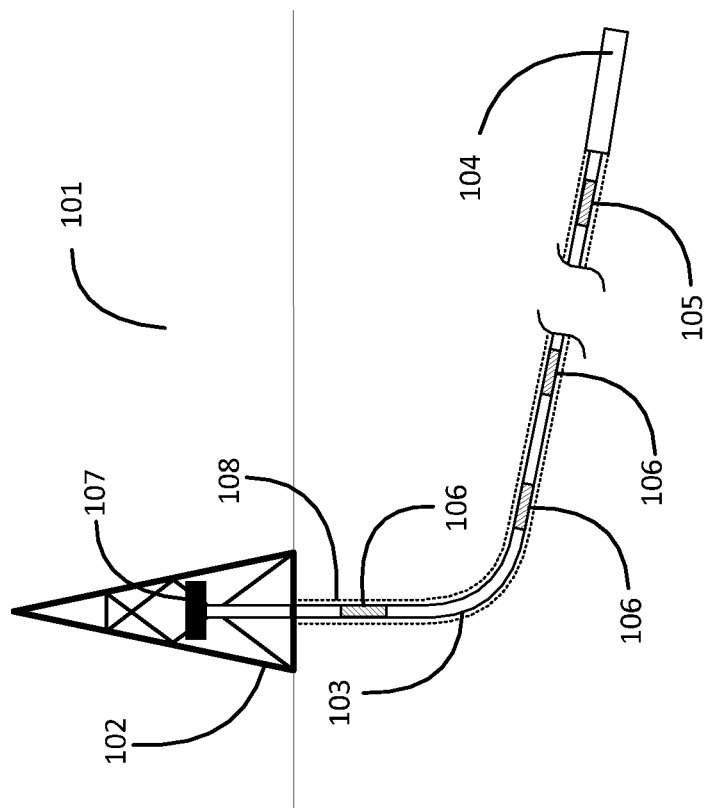
FIG. 2 is a schematic representation of a drill string comprising a downhole acoustic communication system according to embodiments of the invention.

Referring now to FIG. 2, one or more of the acoustic telemetry transmitters can be installed in a drill string. Drill string tubing 103 is suspended in a borehole 108 from a drilling rig 102. The tubing 103 can extend for thousands of feet, and in a typical deployment an acoustic transmitter is part of a telemetry tool 105 in a bottom hole assembly (BHA) 104. Additional acoustic transmitters can be included in repeaters 106 along the length of the tubing 103, with the number of repeaters 106 and the spacing between them determined by the along-string measurements required, if any, at each of the additional locations, and the possible necessity to repeat the acoustic signal if the distance to the surface is too far to transmit successfully with a single acoustic transmitter. The acoustic signal is received at the surface by a receiver 107.

Figure 3:
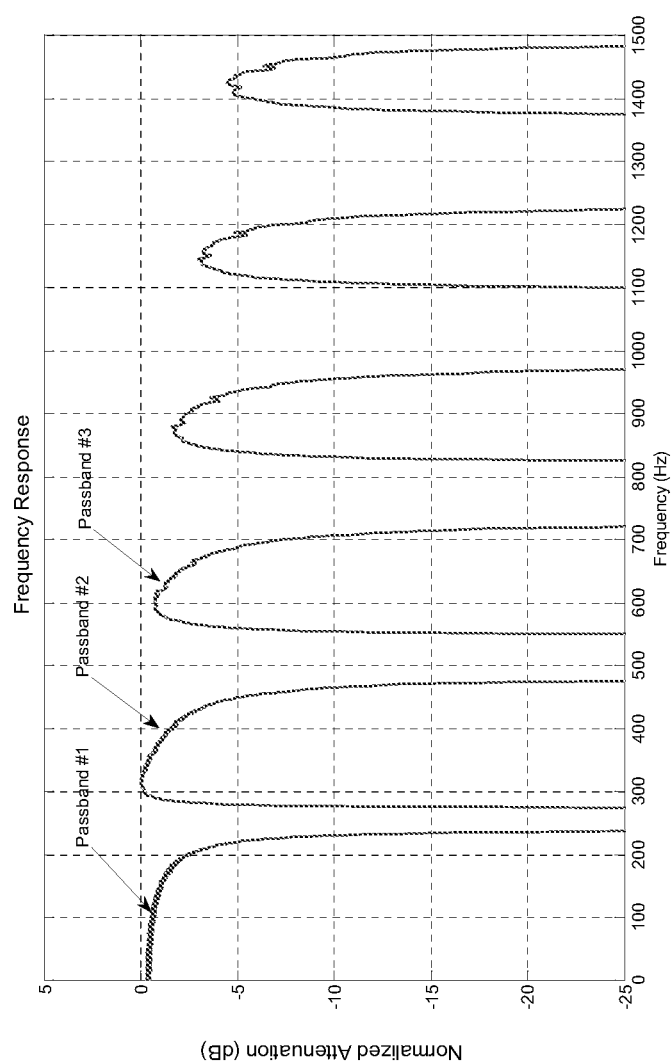
FIG. 3 is a frequency response graph of a modulated acoustic signal transmitted by the downhole acoustic communication system of FIG. 2.

The acoustic transmitters in the described embodiments have a collar-based configuration, with the components of the acoustic transmitter including the piezoelectric transducer, sensors, electronics and batteries being mounted in a wall of a tubular section of the repeater 106 or the telemetry tool 105. However, the acoustic transmitters can have a probe-based or clamp-on configuration according to other embodiments (not shown). As will be described in more detail below, each acoustic transmitter comprises a mandrel defining a through-bore which allows fluid to pass through repeater 106 or telemetry tool 105. Each acoustic transmitter is operable to transmit a modulated acoustic signal as an extensional wave through the drill string components. The connection of several lengths of tubing 103 of similar size and dimensions is well known to form an acoustic frequency response similar to a bandpass comb filter which comprises a number of passbands alternating with stopbands as shown in FIG. 3. The bandwidth of the modulated acoustic signal is limited by the bandwidth of the acoustic passband used for the transmission, although more than one passband can be used to transmit simultaneously which increases the total bandwidth available for the signal and hence the data rate. The telemetry signal travels to the surface, either directly or through the repeaters 106, where it is received and decoded by the receiver 107.

Figure 4:
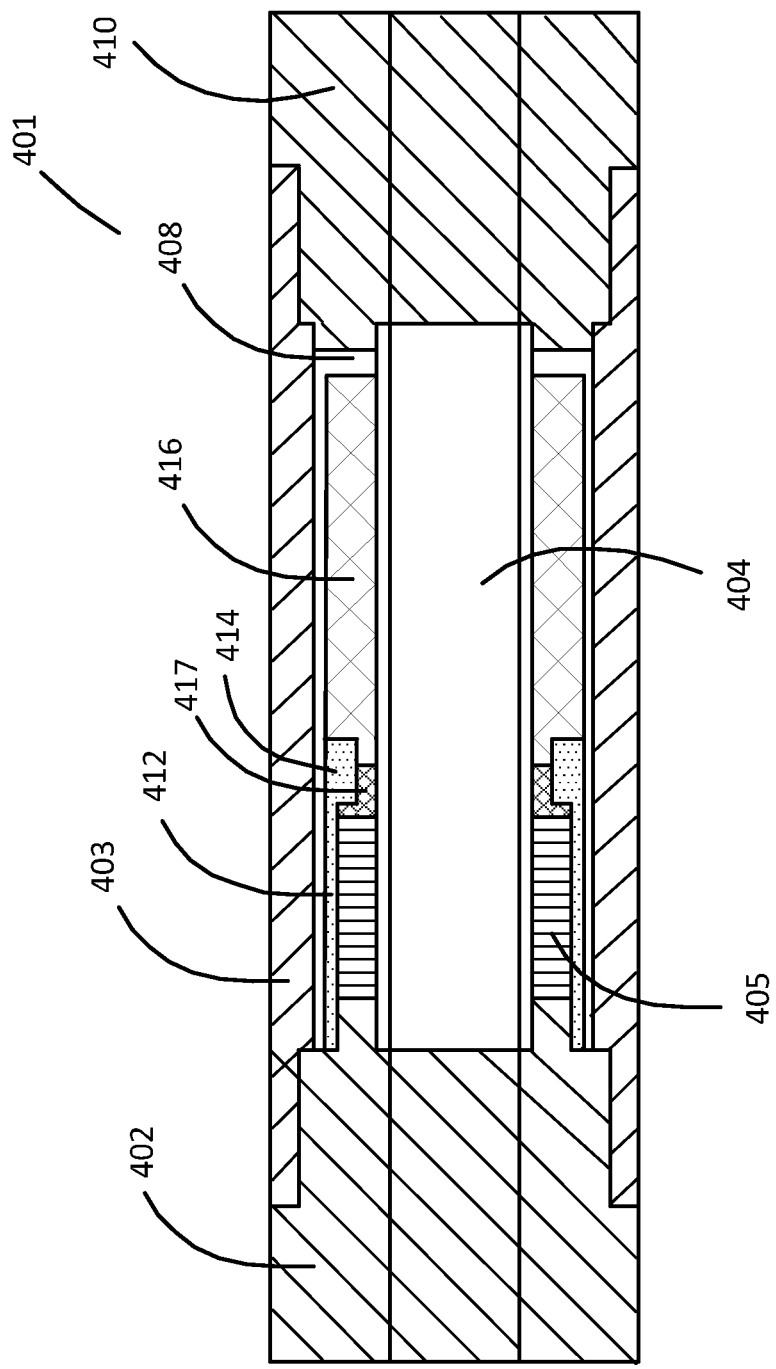
FIG. 4 is a schematic side sectioned view of a downhole acoustic transmitter comprising a casing providing a preload to a piezoelectric stack of the transmitter, according to one embodiment of the invention.

According to one embodiment and referring to FIG. 4, the acoustic transmitter 401 used in the telemetry tool 105 and repeater 106 generally comprises an enclosure, a transducer 405 housed within the enclosure, a transducer preload means for applying a selected compressive load (herein referred to as "preload") on the transducer 405 and which comprises a casing 412 with a rim 414 that contacts a second end of the transducer 405, and an acoustic tuning element 416 coupled to the casing rim 414.

The enclosure comprises a first end coupling 402, a tubular outer housing 403, a cylindrical inner mandrel 404 and a second end coupling 410 (also referred to as a "pin"). The first end coupling 402 has a body with threads on the outer surface of the body ("external threads"), and a central bore extending through the body. A first end of the inner mandrel 404 is externally threaded and engages internal threads in the central bore of the first end coupling 402 along a central axis. Both ends of the outer housing 403 are internally threaded, with an internally threaded first end engaging the external threads of the first end coupling 402 and an internally threaded second end engaging external threads of the second end coupling 410. The second end coupling 410 has a body with a bore extending through the body, and which engages a second end of the inner mandrel 404 by a threaded connection. When assembled, the enclosure defines a through bore that extends through the central bores of the end couplings 402, 410 and the bore of the mandrel 404, such that drilling fluid can flow through the acoustic transmitter 401. The assembled enclosure also defines a fluid-tight annular space for housing the transducer 405, casing 412, and tuning element 416.

The transducer 405 comprises a stack of thin annular piezoceramic discs layered with thin annular electrodes between each disc which are connected electrically in parallel (the transducer is herein alternatively referred to as a "piezoelectric stack" 405). As a result, the stack's electrical behavior is primarily capacitive. Applying a high voltage charges the piezoelectric stack 405 and causes it to increase and decrease in length. It is this deflection that launches extensional waves into the drill pipe (not shown). Data can be carried by the extensional waves by modulating the voltage applied to the piezoelectric stack 405.

The piezoelectric stack 405 slides over the mandrel 404 and has a first end that contacts an inner face of the first end coupling 402. The casing 412 is a metal cylinder that slides over the piezoelectric stack 405 and has a first end that is internally threaded for engaging with threads on the first end coupling 402 thereby connecting the casing 412 with the first end coupling 402; alternatively, the casing first end can be connected to the first end coupling 402 by other known methods. The piezoelectric stack 405 has an annular cap 417 at its second end which is shaped to engage with a rim 414 at a second end of the casing 412. In one embodiment, the rim is internally threaded and engages with threads on the annular cap 417 such that an axial compressive preload force can be applied by the casing against the piezoelectric stack 405. In another embodiment, the rim 414 of the casing 412 has an annular lip that extends inwards from the casing, and this lip abuts against an annular lip of the annular cap 417, such that an axial compressive preload force can be applied by the casing 412 against the piezoelectric stack 405. The amount of compressive preload applied to the piezoelectric stack 405 by the casing 414 can be selected by selecting the properties of the casing material and/or how tightly the casing 412 is threaded onto the first end coupling 402.

Alternatively, the piezoelectric stack 405 has a pair of annular end caps at both ends ("first and second annular end caps", not shown), and the casing 412 is threaded at each end and engages with matching threads in the pair of annular end caps such that the axial compressive preload force can be applied against the piezoelectric stack 405. The first annular end cap can then the attached to the first end coupling 402.

Alternatively, the transducer preload means can have a different structure than a cylindrical metal casing. For example, the transducer preload means can be a carbon fiber or glass fiber wrap surrounding the piezoelectric stack, or multiple tension straps, laminated strips or tie rods (not shown) extending along the length of the piezoelectric stack. The wrap, straps, strips or rods can be connected at one end to the first end coupling 402 and at an opposite end to the annular end cap 417. When the piezoelectric stack 405 is provided with first and second annular end caps, the wrap, straps, strips or rods can be connected to each annular end cap and tensioned to apply a compressive force to the stack.

The acoustic tuning element 416 serves to match the acoustic impedance of the piezoelectric stack 405 with the first end coupling 402, thereby maintaining optimal power output by the acoustic transmitter 401. The acoustic tuning element 416 has a metal tubular body with a threaded first end that engages with threads on the rim 414 of the casing 412, thereby connecting the acoustic tuning element 416 with the casing 412. The acoustic tuning element 416 is slid over the mandrel 404 such that the first end attaches to the casing 412 by the threaded connection. An annular gap exists between the outside surface of the tuning element 416 and the inside surface of the outer housing 403. The length of the tuning element 416 is selected so that an axial gap 408 is formed between the second end of the tuning element 416 and the pin 410. As a result, the second end of the tuning element 416 remains "open"; in other words, the pin 410 is threaded into the outer housing 403 and mandrel 404 to close and seal the annular space but does not contribute to the preload on the piezoelectric stack 405.

The physical environment imposed on the acoustic transmitter 401 can be particularly challenging, with the telemetry tool 106 in particular being subjected to extreme ranges of pressure, temperature, and tension/compression, all of which vary as a function of the tool's placement in the drill string, depth, and the rig's operational state. The orientation of the borehole 108 containing the tubing 103 can be vertical with an inclination of 0 degrees, or may have one or more deviations in orientation along its length resulting in changes of inclination as high as 90 degrees. Due to the length of the tubing 103 and the deviations in its orientation, the tensile and compressive forces that the telemetry tool 106 are subjected to during rig operations can be very high. For example, the telemetry tool 106 may be subject to pressures up to 30 kpsi, tensions over 1,000,000 pounds, and temperatures up to 175° C. Of particular concern to the piezoelectric stack 405 is the flexing of the tool structure under various load conditions. These varying load conditions can affect the mechanical energy output by conventional acoustic transmitters as the compressive load on the piezoelectric stack in such transmitters can vary. In the extreme, conventional piezoelectric stacks can be depolarized due to excessive compression caused by compression on the tool, or be damaged when the stack compression falls below safe operating levels during periods of high tension on the tool. In contrast, the preload applied by the casing 412 on the transducer 405 in the transmitter 401 is not affected by the varying load conditions experienced during rig operations, since the axial gap 408 prevents the pin 410 from contacting the tuning element 416/casing 412 when the transmitter 401 is subjected to compression, and allows the casing 412 and tuning element 416 to slide relative to the mandrel 404 and outer housing 403 when the transmitter 401 is subjected to tension or compression.

As the preload is now independent of the tension/compression of the tool 401, the amount of preload and can be set to a constant optimum value for maximum stack output acoustic power. The acoustic output power of the stack will be stabilized by the constant preload. Any variations in the DC power drawn by the stack may be reduced compared to conventional acoustic transmitters in which their transducers are subjected to varying compressive loads. Further, the combined effects of temperature, electric field and the compressive mechanical preload that can lead to a depolarization of the stack may be reduced due to the lower mechanical preload level compared to conventional acoustic transmitters.

As noted above, the acoustic tuning element 416 serves to match the acoustic impedance of the piezoelectric stack 404. The acoustic tuning element 416 comprises a structure that is tuned such that when it is attached to the end of the casing 412 its acoustic impedance reduces the piezoelectric stack 405 compliance at the frequencies being transmitted, and restores the acoustic match between the piezoelectric stack 405 and the first end coupling 402 without affecting the preload applied to the piezoelectric stack 405 by the casing 412.

For optimal acoustic output power, the piezoelectric stack 405 should be matched at either end with acoustic impedances equal to that of the piezoelectric stack 405; however the additional compliance of the casing 412 reduces the acoustic impedance seen by the piezoelectric stack 405 at the end at which the preload force is applied. The acoustic impedance of a segment of a cylinder of length l can be determined using the four-pole matrix solution to the wave equation. The four-pole solution can be written as:

$$\begin{bmatrix} F(x+l) \\ V(x+l) \end{bmatrix} = \begin{bmatrix} \cos(kl) & iz\sin(kl) \\ \frac{i\sin(kl)}{z} & \cos(kl) \end{bmatrix} \begin{bmatrix} F(x) \\ V(x) \end{bmatrix}$$

in which $$k = \left(\frac{2\pi f}{c}\right),$$

where c is the wave speed which is defined as $$c = \sqrt{\frac{E}{\rho}}$$

where E is the Young's modulus of the cylinder material and $\rho$ is the mass density of the material. The force at one end of the cylinder at x+l can be written as $$F(x+l)=F(x)\cos(kl)+izV(x)\sin(kl) \quad \text{Equation 1}$$

in which z is the wave impedance of the cylinder which is defined as z=$\rho$ca, and a is the cross sectional area of the cylinder. In the case of a cylinder with an open end F(x+l)=0, resulting in an acoustic impedance at the opposing end of the cylinder of:

$$Z_a(x) = \frac{F(x)}{V(x)} = -\frac{iz\sin(kl)}{\cos(kl)} = -iz\tan(kl) \quad \text{Equation 2}$$

wherein i indicates the imaginary part of a complex number and is defined as the sqrt(−1).

For example, a steel cylinder 3.2 m long and 0.1 m in diameter and a 3800 mm² cross sectional area can be used to represent the combined acoustic impedance of a casing and an acoustic tuning element; the acoustic impedance at a first end of the cylinder given a free end at the second end of the cylinder can be calculated using Equation 2. The resulting acoustic impedance contains peaks and nulls in magnitude which occur at frequencies corresponding to integer multiples of quarter wavelengths of the first resonant frequency. FIG. 6(a) shows the first peak occurring at a cylinder length of l=$\lambda$/4. The impedance peak shown in FIG. 6(a) is too high to be of any use, however the acoustic impedance level on the higher frequency side of the resonance peak is low enough to be useful. FIG. 6(b) shows the magnitude of the cylinder's acoustic impedance across the third acoustic passband of the drill string as shown in FIG. 3. The properties of the tuning element disclosed here is only one possible example; the impedance behavior of the tuning element can be controlled through choice of materials, the length of the tuning element, the mass of the tuning element and the distribution of the mass along the length of the tuning element.

Figure 5:
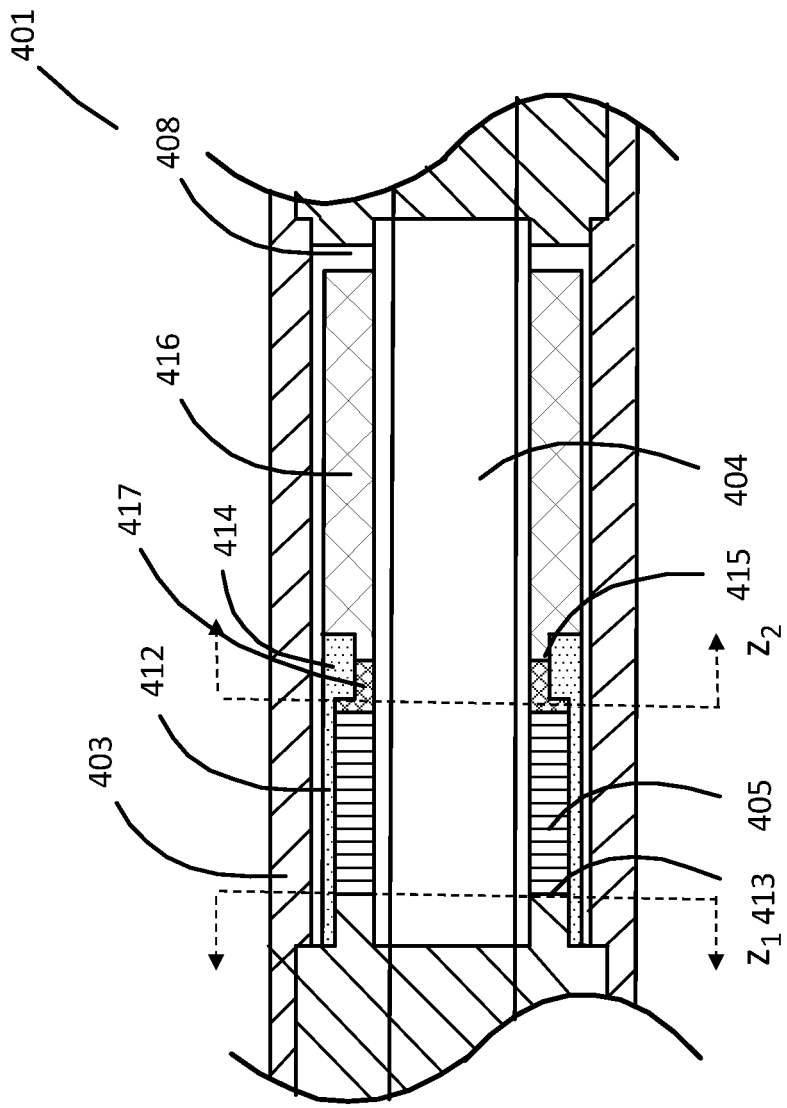
FIG. 5 is a detailed side sectioned view of a portion of the downhole acoustic transmitter shown in FIG. 4.

FIG. 5 shows a detailed view of the internal components of the acoustic transmitter 401. In particular, a first mechanical interface 413 is shown between the first end coupling 402 and the piezoelectric stack 405, and a second mechanical interface 415 is shown between the piezoelectric stack 405 and both the cylindrical acoustic tuning element 416 and the casing 412. At the first mechanical interface 413, in an acoustically matched system the acoustic impedance $Z_1$ of the first end coupling 402 would be the same as the acoustic impedance of the piezoelectric stack 405. This condition is also true for the acoustic impedance $Z_2$ at the second mechanical interface 415. However if only the casing 412 is applied then the compliance of the casing 414 is too high to offer the required acoustic impedance and the output power of the piezoelectric stack 405 is reduced. The addition of the acoustic tuning element 416 reduces the compliance of the casing, restoring the acoustic impedance to the required value. Ideally, the acoustic tuning element 416 has a selected impedance that when combined with the acoustic impedance of the casing 412, equals the acoustic impedance at the first mechanical interface 413, i.e. the acoustic impedance of the first end coupling 402.

Figure 7:
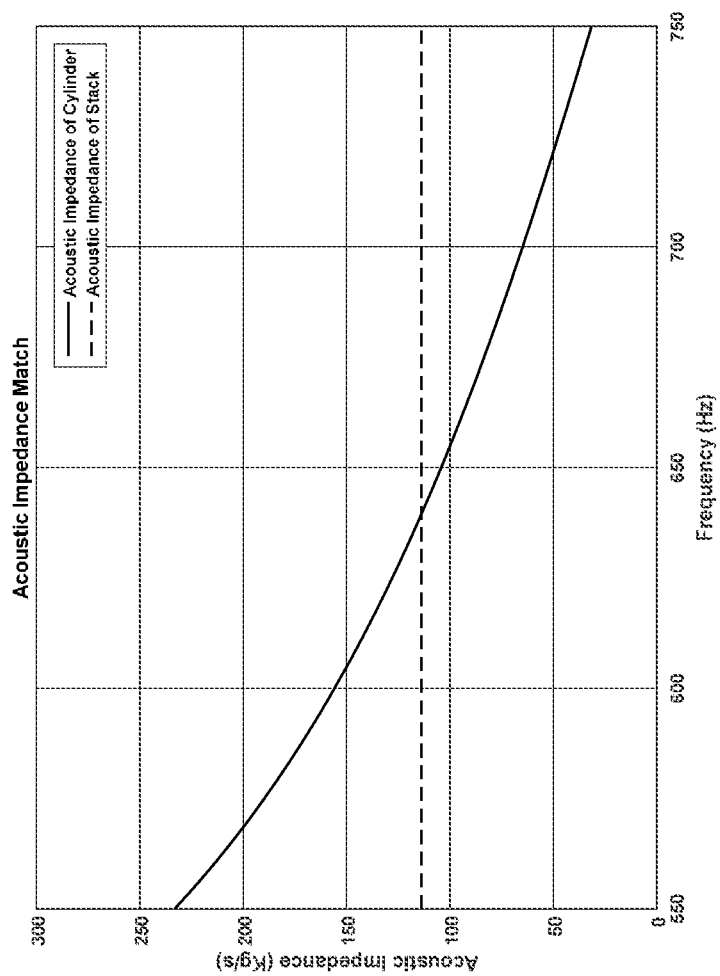
FIG. 7 is a graph of the acoustic impedance of a piezoelectric stack and the acoustic impedance of an acoustic tuning element of an example downhole acoustic transmitter.

To demonstrate, given a common piezoelectric material with a density of 7.5 Mg/m³, and a Young's modulus of 9.9*10¹⁰ N/m², then a piezoelectric stack with a length of 0.142 m and a cross sectional area of 4200 mm² will have a wave impedance of 114 Kg/s. FIG. 7 shows that the combined acoustic impedance of the tuning element and the casing (labeled "cylinder" in FIG. 7) is equal to that of the piezoelectric stack at 640 Hz ("center frequency"), with a useable operating frequency bandwidth across the 600 Hz to 700 Hz bandwidth of the third passband of the drill string. In other words, the usable range of acoustic impedance of the tuning element 416 in this example is between 70 kg/s and 160 kg/s for a selected operating frequency bandwidth of 600-700 Hz. While the usable operating frequency bandwidth of the tuning element in this case is about 15% of the center frequency, the usable operating frequency bandwidth and resulting usable acoustic impedance range of the tuning element can vary based on the physical properties of the piezoelectric stack and enclosure, as well as on the operating conditions. Generally speaking, the acoustic impedance of the tuning element can be within a selected range that maximizes acoustic power transfer from the piezoelectric stack into the enclosure over a selected usable operating frequency bandwidth.

The single tuning mass system of the present embodiment offers a relatively narrow band response. This can limit the frequency bandwidth that can be transmitted. In an alternative embodiment (not shown), the acoustic transmitter comprises at least one additional tuning element that has been tuned to a different quarter-wave frequency than the first tuning element. The combination of the two (or more) tuning elements can give a broader frequency range or broader operating bandwidth within the acoustic passband than that of a single element. Alternatively, the second tuning element can be tuned for a completely different acoustic passband at either a higher or lower frequency than the first tuning element. This would enable a dual passband transmission which could be either simultaneous or choosing one of the two for a given transmission. The additional acoustic tuning elements can include a second acoustic tuning element (not shown) either having a first end coupled to the second end of the transducer or preload means in a parallel configuration with the acoustic tuning element 416 (herein referred to as the "first acoustic tuning element"), or having a first end coupled to the second end of the first acoustic tuning element, and a second end that is axially spaced from the second end coupling such that an axial gap is defined there between, and such that an assembly comprising the casing 412, transducer and the first and second acoustic tuning elements are attached to the enclosure only at the first end coupling. Alternatively or additionally, the additional acoustic tuning elements can include a tuning spacer (not shown) in between and in contact with the first end coupling and the first end of the piezoelectric transducer or the transducer preload means. The tuning spacer can be tuned to increase the frequency range of the impedance match or increase the number of impedance matches over a frequency range compared to the first acoustic tuning element alone.

While the illustrative embodiments of the present invention are described in detail, it is not the intention of the applicant to restrict or in any way limit the scope of the appended claims to such detail. Additional advantages and modifications within the scope of the appended claims will readily be apparent to those skilled in the art. The invention in its broader aspects is therefore not limited to the specific details, representative apparatus and methods, and illustrative examples shown and described. Accordingly, departures may be made from such details without departing from the spirit or scope of the general concept.

What is claimed is:

1. A method for acoustic transmission from a downhole location, comprising:
   (a) applying a compressive preload force in an axial direction against a piezoelectric transducer by a transducer preload means such that the piezoelectric transducer is compressed, wherein an assembly comprising the piezoelectric transducer and the transducer preload means is attached to a first end coupling of an enclosure of a downhole acoustic transmitter;
   (b) tuning the acoustic impedance of the piezoelectric transducer by attaching a first end of an acoustic tuning element having a selected acoustic impedance to the transducer preload means or to the piezoelectric transducer, and wherein a second end of the acoustic tuning element is spaced from a second end coupling of the enclosure such that an axial gap is defined there between; and
   (c) applying a voltage to the piezoelectric transducer to generate an acoustic transmission.

2. The method as claimed in claimed in claim 1 wherein tuning the acoustic impedance of the piezoelectric transducer comprises selecting an acoustic impedance of the acoustic tuning element that when combined with an acoustic impedance of the piezoelectric transducer, matches the acoustic impedance of an inner face of the first end coupling contacting the piezoelectric transducer.

\* \* \* \* \*